(12) United States Patent
Giduturi et al.

(10) Patent No.: US 10,897,592 B1
(45) Date of Patent: Jan. 19, 2021

(54) COMBINED PROGRAMMABLE GAIN AMPLIFIER AND COMPARATOR FOR LOW POWER AND LOW AREA READOUT IN IMAGE SENSOR

(71) Applicant: Foveon, Inc., San Jose, CA (US)

(72) Inventors: SundaraSiva Rao Giduturi, Cupertino, CA (US); Glenn Jay Keller, West Chester, PA (US)

(73) Assignee: Foveon, Inc., San Jose, CA (US)

( * ) Notice: Subject to any disclaimer, the term of this patent is extended or adjusted under 35 U.S.C. 154(b) by 0 days.

(21) Appl. No.: 16/572,580

(22) Filed: Sep. 16, 2019

(51) Int. Cl.
*H04N 5/378* (2011.01)
*H03F 3/45* (2006.01)
*H03G 3/30* (2006.01)

(52) U.S. Cl.
CPC ......... *H04N 5/378* (2013.01); *H03F 3/45475* (2013.01); *H03G 3/30* (2013.01); *H03F 2200/129* (2013.01); *H03F 2203/45116* (2013.01); *H03F 2203/45512* (2013.01); *H03G 2201/103* (2013.01)

(58) Field of Classification Search
CPC .......... H04N 5/378; H03F 2203/45512; H03F 2203/45116; H03F 2200/129; H03G 3/30; H03G 2201/103
See application file for complete search history.

(56) References Cited

U.S. PATENT DOCUMENTS

| | | | | |
|---|---|---|---|---|
| 3,656,003 | A * | 4/1972 | Chen | H03K 5/02 365/209 |
| 4,443,717 | A * | 4/1984 | Hague | H03K 5/24 327/318 |
| 5,600,280 | A * | 2/1997 | Zhang | H03B 5/24 327/180 |
| 2012/0133808 | A1* | 5/2012 | Park | H04N 5/378 348/294 |
| 2013/0020469 | A1* | 1/2013 | Okura | H04N 5/378 250/208.1 |
| 2015/0200633 | A1* | 7/2015 | Yang | H03F 3/45179 327/97 |
| 2017/0250661 | A1* | 8/2017 | Imaizumi | H03K 5/24 |
| 2018/0098015 | A1* | 4/2018 | Lee | H04N 5/37455 |

* cited by examiner

*Primary Examiner* — Jason A Flohre
(74) *Attorney, Agent, or Firm* — Glass and Associates; Kenneth Glass; Kenneth D'Alessandro (57) ABSTRACT

A switchable amplifier and comparator circuit includes an operational amplifier having an inverting input, a non-inverting input, a first differential output and a second differential output, the first differential output switchably coupled to the inverting input and the second differential output switchably coupled to the non-inverting input. A first feedback capacitor is coupled to the inverting input and switchably coupled to the first differential output, a second feedback capacitor is coupled to the non-inverting input and switchably coupled to the second differential output. A capacitive load is switchably coupled between the first differential output and the second differential output. A diode clamp circuit is switchably coupled between the first differential output and the second differential output. A resistive load is switchably coupled between the first differential output and the second differential output.

7 Claims, 7 Drawing Sheets

COMBINED PROGRAMMABLE GAIN AMPLIFIER AND COMPARATOR FOR LOW POWER AND LOW AREA READOUT IN IMAGE SENSOR

The present invention relates to image sensing arrays. More particularly, the present invention relates to a combined programmable gain amplifier and comparator for low power and small area readout in image sensors.

BACKGROUND

Figures 1, 4:
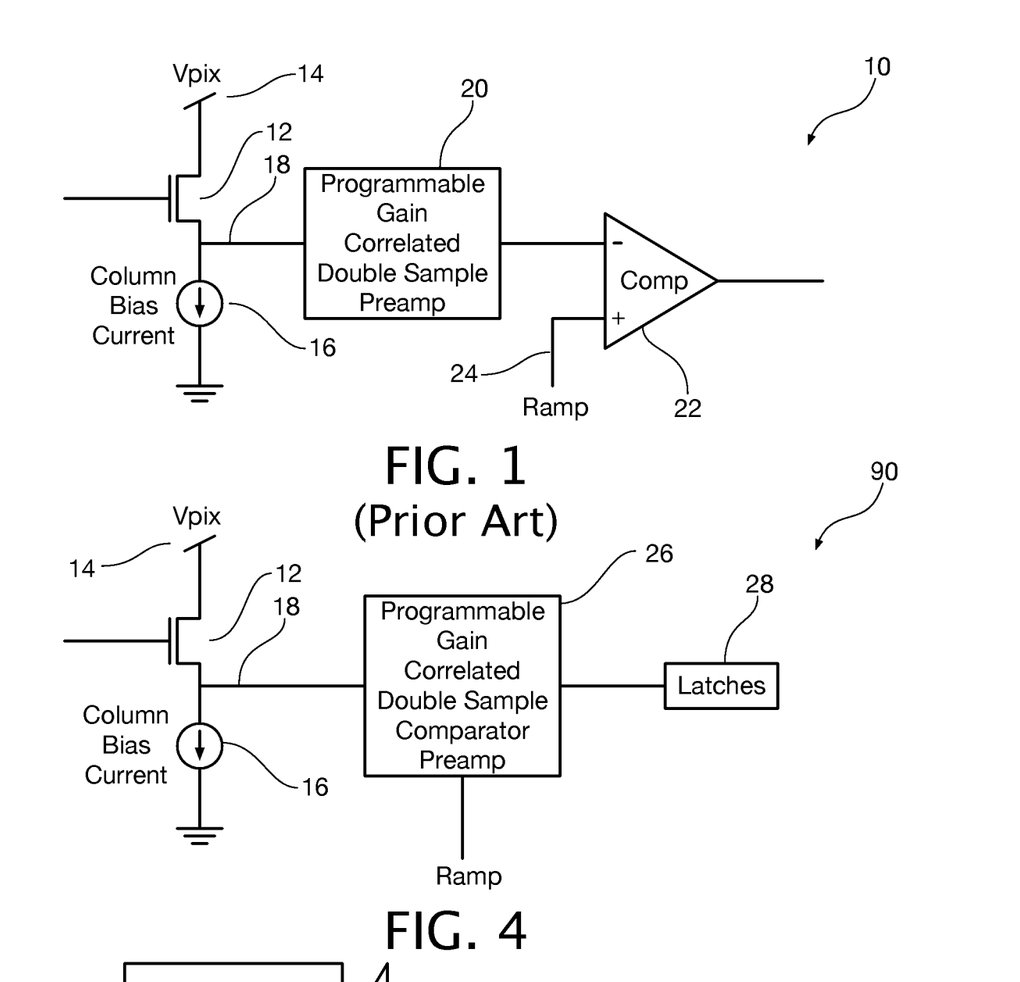
FIG. 1 is a schematic diagram showing a prior-art programmable gain amplifier with correlated double sampling and comparator for readout of pixel sensors in an image sensing array.
FIG. 4 is a schematic diagram showing a combined amplifier and comparator including a programmable gain amplifier with correlated double sampling and comparator for readout of pixel sensors in an image sensing array in accordance with an aspect of the present invention.

Referring first to FIG. 1, a schematic diagram shows a prior-art programmable gain amplifier (PGA) with correlated double sampling followed by a comparator for readout of pixel sensors in an image sensing array. The input signal for the prior-art programmable gain amplifier with correlated double sampling and comparator is shown as the output of a typical pixel sensor at the source of a source-follower transistor 12 having its drain connected to a voltage supply $V_{pix}$ indicated at reference numeral 14. The source of the source-follower transistor 12 drives a current indicated at reference numeral 16 onto a column line 18.

In the prior art, the output voltage of the column line 18 is amplified by the programmable gain amplifier (PGA) 20, which provides a correlated double sampling function. The output of the PGA 20 is an analog signal. A comparator 22 compares the analog output of the PGA 20 with a ramp signal on line 24 as is known in the art.

The comparator 22 is usually a pre-amplifier followed by latches. The pre-amplifier reduces the effect of kickback from the latches; and also amplifies the differential signal at its input. The latches convert this pre-amplifier output to rail-to-rail levels for digital processing.

Figure 2:
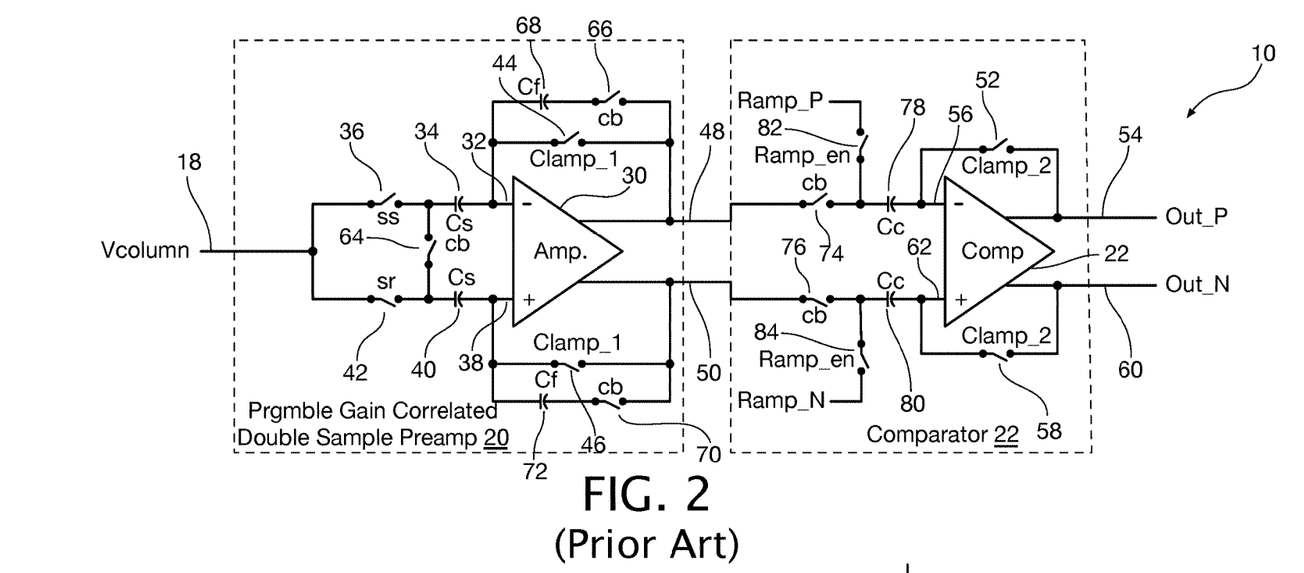
FIG. 2 is a schematic diagram showing in more detail a prior-art programmable gain amplifier with correlated double sampling and comparator such as the one depicted in FIG. 1.

Referring now to FIG. 2, a schematic diagram shows in more detail a prior-art programmable gain amplifier 10 including an amplifier 30 with correlated double sampling and comparator 22 such as the one depicted in FIG. 1. The voltage $V_{column}$ is sampled from the column 18 to the inverting input 32 of the operational amplifier 30 through sampling capacitor $C_s$ 34 during the ss phase when switch 36 is closed and to the non-inverting input 38 of the operational amplifier 30 through sampling capacitor $C_s$ 40 during the sr phase when switch 42 is closed.

During these two sampling phases ss and sr, switches 44 and 46, controlled by the Clamp_1 signal are closed, shorting output node 48 to the inverting input 32 of the amplifier 30 and the output node 50 to the non-inverting input 38 of the amplifier 30.

After the Clamp_1 signal has been de-asserted, the Clamp_2 signal is asserted followed by the crowbar (CB) signal. The Clamp-2 signal closes switch 52, shorting the output node Out_P 54 of the comparator 22 to its inverting input 56 and also closes switch 58, shorting the output node Out_N 60 of the comparator 22 to its non-inverting input 62.

The crowbar signal cb closes switch 64, shorting together the input plates of capacitors 34 and 40. The crowbar signal cb also closes switch 66, connecting feedback capacitor Cf 68 between the output node 48 of amplifier 30 and its inverting input 32, and closes switch 70, connecting feedback capacitor Cf 72 between the output node 50 of amplifier 30 and its non-inverting input 38.

The crowbar signal cb also closes switches 74 and 76, connecting the output nodes 48 and 50, respectively, of the amplifier 30 to the input nodes 56 and 62 of the comparator 22 through capacitors Cc 78 and 80, respectively.

At the end of the crowbar (cb) phase, the difference between the voltages at nodes 48 and 50 is: (Vss−Vsr)*Cs/Cf; Vss is the $V_{column}$ during ss phase; and Vsr is the $V_{column}$ during the sr phase. This voltage is sampled onto the Cc capacitors 78 and 80 during the cb phase.

When the Ramp_en signal is asserted, switches 82 and 84 are closed and the difference between the voltage at the Out_P and Out_N nodes 54 and 60 is =Out_P−Out_N= (Vsr−Vss)*Cs/Cf −(Ramp_P−Ramp_N). This voltage is converted to rail-to-rail by following latches.

Figure 3:
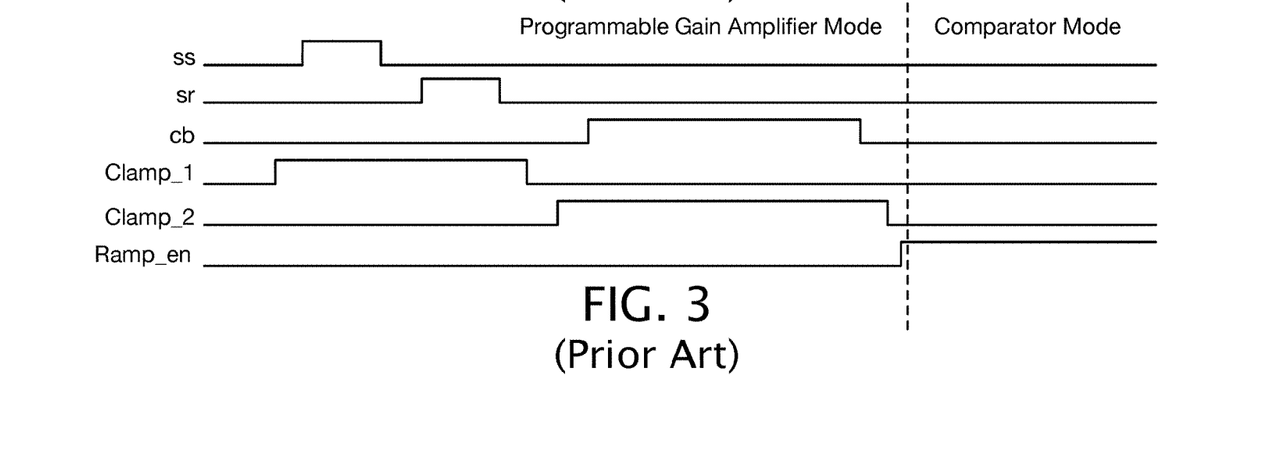
FIG. 3 is a timing diagram showing the control signals applied to operate the prior-art programmable gain amplifier with correlated double sampling and comparator of FIG. 2.

Referring now to FIG. 3, a timing diagram shows the relative timing of the ss, sr, cb, Clamp_1, Clamp_2, and Ramp_en control signals applied to operate the prior-art programmable gain amplifier with correlated double sampling and comparator of FIG. 2.

Area, power, and noise tradeoffs need to be made in the circuit design of FIG. 2. The feedback capacitors are initialized to the minimum differential ramp voltage instead of 0V. The output of the prior-art circuit of FIG. 2 is:

$$\text{Out\_P}-\text{Out\_N}=(Vsr-Vss)*Cs/Cf-(\text{Ramp\_P}-\text{Ramp\_N})$$

BRIEF DESCRIPTION

In accordance with an aspect of the invention, a switchable amplifier and comparator circuit includes an operational amplifier having an inverting input, a non-inverting input, a first differential output and a second differential output, the first differential output switchably coupled to the inverting input and the second differential output switchably coupled to the non-inverting input, a first feedback capacitor having a first plate coupled to the inverting input and a second plate switchably coupled to the first differential output, a second feedback capacitor having a first plate coupled to the non-inverting input and a second plate switchably coupled to the second differential output, a capacitive load switchably coupled between the first differential output and the second differential output, a diode clamp circuit switchably coupled between the first differential output and the second differential output, a resistive load switchably coupled between the first differential output and the second differential output.

In accordance with an aspect of the invention, the switchable amplifier and comparator circuit further includes a first sampling capacitor coupled between the inverting input and a first switched input node, the first switched input node switchably coupled to a signal input node, and a second sampling capacitor coupled between the non-inverting input and a second switched input node, the second switched input node switchably coupled to the signal input node and switchably coupled to the first switched input node.

In accordance with an aspect of the invention, the second plate of the first feedback capacitor is switchably coupled to a positive ramp signal, and the second plate of the second feedback capacitor is switchably coupled to a negative ramp signal.

In accordance with an aspect of the invention, the first feedback capacitor includes a plurality of individual first feedback capacitors that are programmably connected in parallel with one another, and the second feedback capacitor includes a plurality of individual second feedback capacitors that are programmably connected in parallel with one another.

In accordance with an aspect of the invention, the plurality of individual first feedback capacitors are programmably connected in parallel with one another through passgates and the plurality of individual second feedback capacitors are programmably connected in parallel with one another through passgates.

In accordance with an aspect of the invention, the plurality of individual first feedback capacitors have equal capacitance, and the plurality of individual second feedback capacitors that are programmably connected in parallel with one another have capacitance values that are weighted with respect to one another.

In accordance with an aspect of the invention, a method for downloading data from an imaging array into a single output circuit includes configuring the output circuit to sample a pixel sensor output from a column of the array, configuring the output circuit to sample a reset state output from the column of the array, configuring the output circuit to generate a programmable gain correlated double signal sampled signal from the sampled pixel sensor output and the sampled reset state output, and configuring the output circuit as a comparator to compare the programmable gain correlated double signal sampled signal with a ramp signal.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description is illustrative only and not in any way limiting. Other embodiments will readily suggest themselves to such skilled persons.

Referring now to FIG. 4, a schematic diagram shows a combined amplifier and comparator 90 including an amplifier 26 with correlated double sampling and comparator for readout of pixel sensors in an image sensing array in accordance with an aspect of the present invention. The architecture of the present invention combines the PGA 20 and the comparator pre-amplifier 22 of the prior-art arrangement of FIG. 1 into a single block 26 which reduces area and power consumption.

The combined amplifier and comparator 90 of FIG. 4 shares some elements in common with the prior-art circuit depicted in FIG. 1. Those common elements will be designated using the same reference numerals used to identify them in FIG. 1.

As with the prior-art arrangement, the input signal for the combined amplifier and comparator 90 is the output of a typical pixel sensor at the source of a source-follower transistor 12 having its drain connected to a voltage supply $V_{pix}$ indicated at reference numeral 14. The source of the source-follower transistor 12 drives a current indicated at reference numeral 16 onto a column line 18.

The combined amplifier and comparator 90 employs a single amplifier 26 that serves as both the PGA with correlated double sampling and the comparator. Latches 28 capture the output of the comparator.

Figure 5:
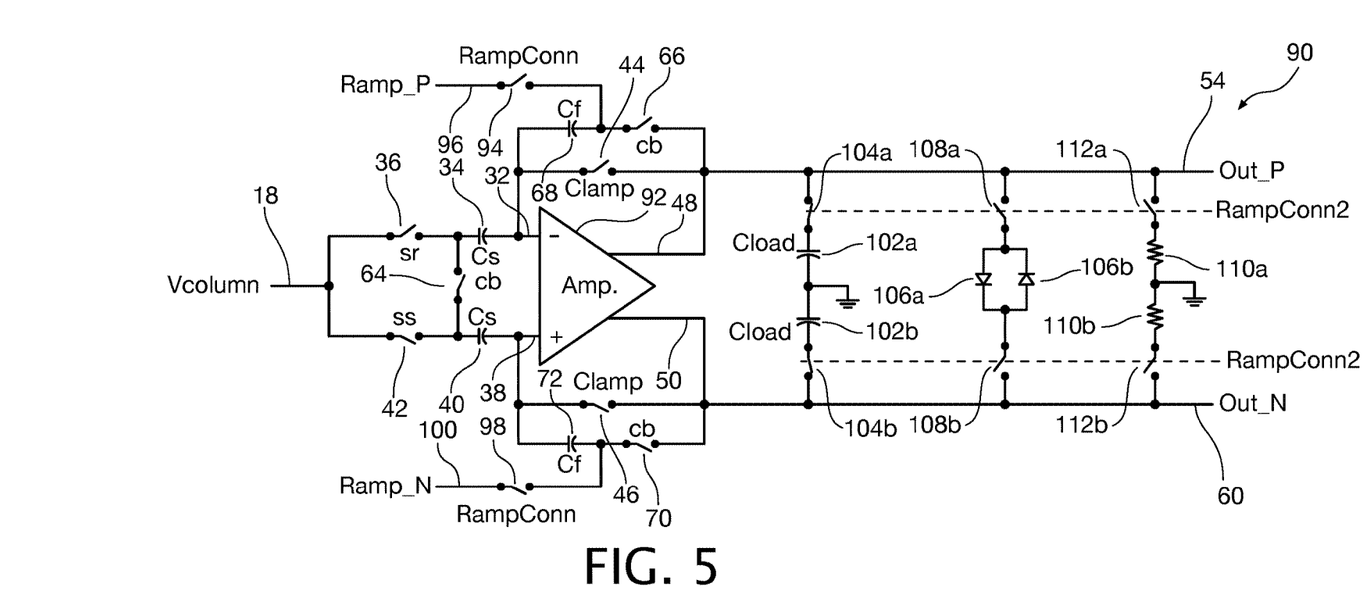
FIG. 5 is a schematic diagram showing in more detail a combined amplifier and comparator including a programmable gain amplifier with correlated double sampling and comparator such as the one depicted in FIG. 4 in accordance with an aspect of the present invention.

Referring now to FIG. 5 a schematic diagram shows in more detail a combined amplifier and comparator 90 such as the one depicted in FIG. 4 in accordance with an aspect of the present invention. The circuit of FIG. 5 shares some elements in common with the prior-art circuit depicted in FIG. 2. Those common elements will be designated using the same reference numerals used to identify them in FIG. 2.

A differential operational amplifier 92 has its inverting input 32 coupled to the column line 18 through sampling capacitor Cs 34 and switch 36. Switch 36 is controlled by the sample reset (sr) signal. The non-inverting input 38 of the differential operational amplifier 92 is coupled to the column line 18 through sampling capacitor Cs 40 and switch 42. Switch 42 is controlled by the sample signal (ss).

The positive output 48 of the differential operational amplifier 92 is coupled to its inverting input 32 through a clamp switch 44. The negative output 50 of the differential operational amplifier 92 is coupled to its non-inverting input 38 through a clamp switch 46.

The positive output 48 of the differential operational amplifier 92 is also coupled to its inverting input 32 through a switch 66 in series with a feedback capacitor Cf 68. The negative output 50 of the differential operational amplifier 92 is also coupled to its non-inverting input 38 through a switch 70 in series with a feedback capacitor Cf 72. The switches 66 and 70 are controlled by the crowbar (cb) signal.

The common connection of the switch 66 and the feedback capacitor Cf 68 is coupled through a switch 94 to a Ramp_P signal at reference numeral 96. The common connection of the switch 70 and the feedback capacitor Cf 72 is coupled through a switch 98 to a Ramp_N signal at reference numeral 100.

A capacitive load including capacitors 102a and 102b is selectively connected across the output nodes 54 and 60 of the combined amplifier and comparator 90 (nodes that are the same as the output nodes 48 and 50 of the differential operational amplifier 92) through switches 104a and 104b. A diode clamp circuit including diodes 106a and 106b is selectively connected across the output nodes 54 and 60 of the combined amplifier and comparator 90 through switches 108a and 108b, respectively. A resistive load including resistors 110a and 110b is selectively connected across the output nodes 54 and 60 of the combined amplifier and comparator 90 through switches 112a and 112b, respectively.

The switches 104a, 104b, 108a, 108b, 112a, and 112b are all controlled by the signal RampConn2 Switches 104a and 104b are normally closed when the signal RampConn2 is de-asserted and are opened when the signal RampConn2 is asserted. The switches 64, 108a, 108b, 112a, and 112b are all normally opened when the signal RampConn2 is de-asserted and are closed when the signal RampConn2 is asserted.

Figure 6:
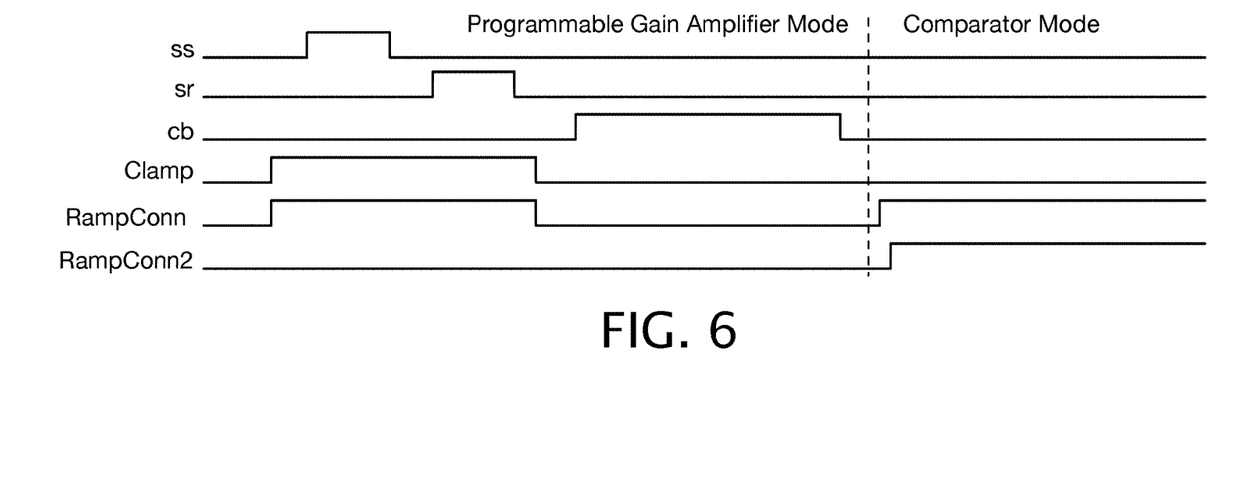
FIG. 6 is a timing diagram showing the control signals applied to control the switches that configure the combined amplifier and comparator of FIG. 5.

Referring now to FIG. 6, a timing diagram shows the control signals applied to control the programmable gain amplifier with correlated double sampling and comparator of FIG. 5 during all of the phases of its operation in accordance with an aspect of the present invention. The control signals ss, sr, cb, Clamp, RampConn, and RampConn2 are shown and their effects on the circuit of FIG. 5 during the various phases of its operation will be shown in FIGS. 7, 9, 11, and 13.

Figure 7:
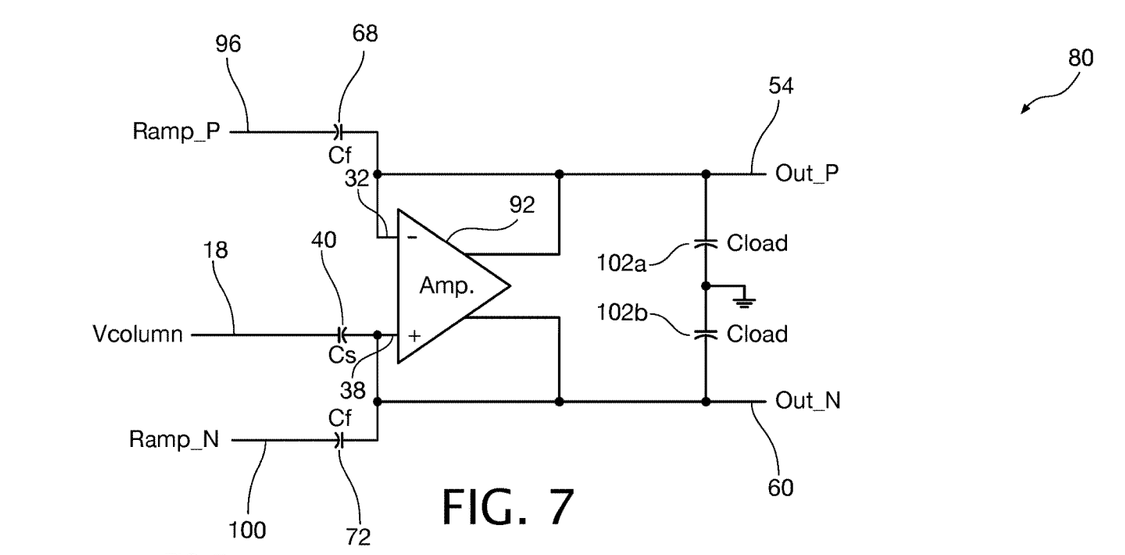
FIG. 7 is a schematic diagram of the circuit of FIG. 5 showing the equivalent circuit resulting from the states of the switches of the circuit of FIG. 5 diagram when the circuit is in sample "ss" phase of operation.

Referring now to FIG. 7, a schematic diagram depicts the configuration of the circuit of FIG. 5 when the circuit is in sample ss phase of operation and shows the equivalent circuit resulting from the states of the switches of the circuit of FIG. 5 when the circuit is in sample ss phase of operation. During the sample ss phase of operation, the signal on the column line is sampled. Switches 42, 44, 46, 94, 98, 104a and 104b of FIG. 5 are closed and are shown as wires. Switches 36, 66, 70, 108a, 108b, 112a, and 112b of FIG. 5 are open and thus are not shown in FIG. 7.

As seen in FIG. 7, the voltage $V_{column}$ is sampled from the column 18 to the non-inverting input 38 of the operational amplifier 92 through sampling capacitor $C_s$ 40 during the ss phase when switch 42 is closed. As will be disclosed herein, the operational amplifier 92 serves as both the PGA and the comparator of the circuit of FIG. 5.

Figure 8:
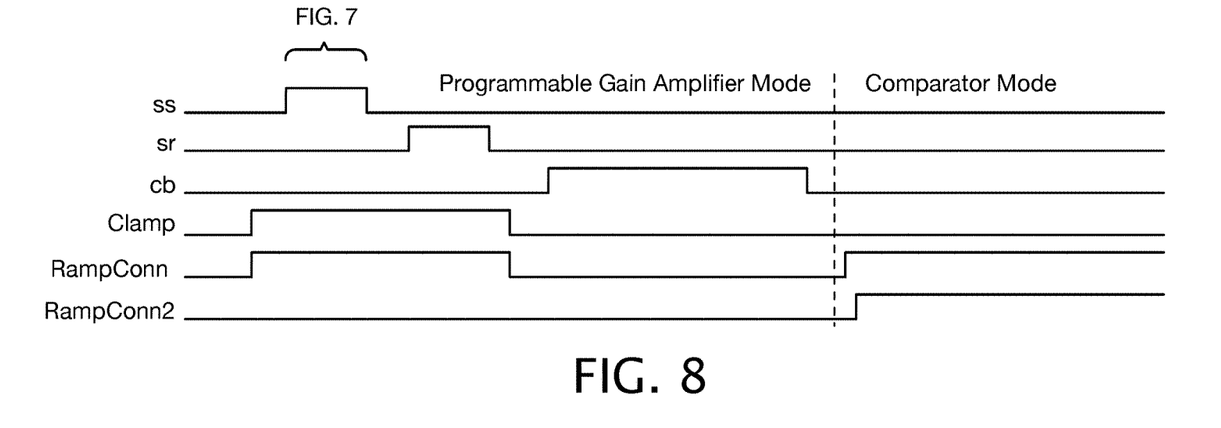
FIG. 8 is the timing diagram of FIG. 6 including brackets that indicate the control signals applied to the switches to configure the circuit during the sample "ss" phase of operation of the circuit.

Referring now to FIG. 8, a timing diagram shows the control signals applied to the switches during the sample ss phase of operation of the circuit to control the states of the switches.

Figure 9:
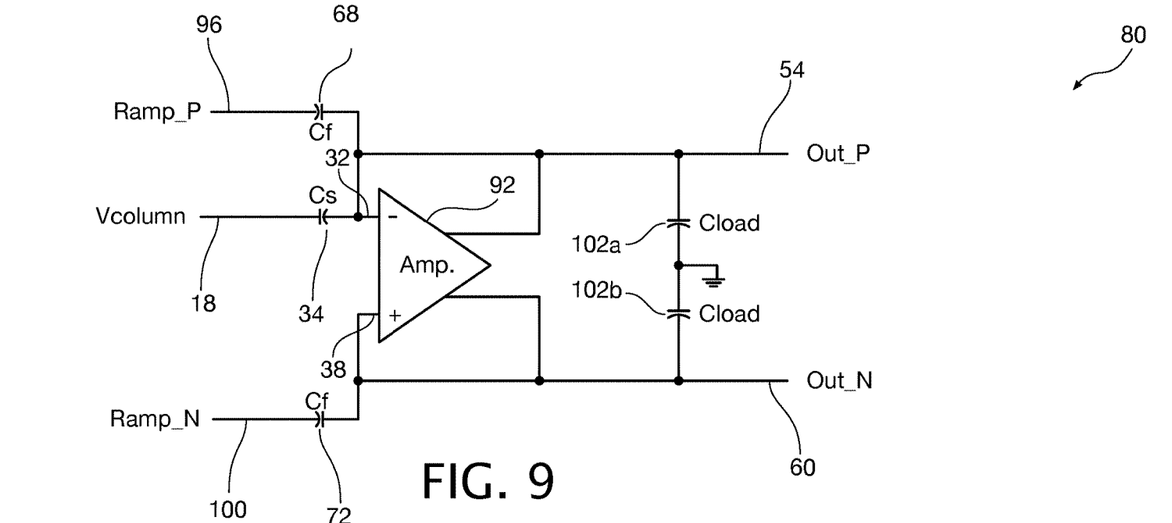
FIG. 9 is a schematic diagram of the circuit of FIG. 5 showing the equivalent circuit resulting from the states of the switches of the circuit of FIG. 5 diagram when the circuit is in sample "sr" phase of operation.

Referring now to FIG. 9, a schematic diagram depicts the configuration of the circuit of FIG. 5 when the circuit is in the sample sr phase of operation and shows the equivalent circuit resulting from the states of the switches of the circuit of FIG. 5 diagram when the circuit is in sample sr phase of operation. During this phase of operation, the voltage on the column in its reset state is sampled. Switches 36, 44, 46, 94, 98, 104a and 104b are closed. Switches 42, 66, 70, 108a, 108b, 112a, and 112b are open.

As seen in FIG. 9, during the sample sr phase of operation, the voltage on $V_{column}$ 18 is sampled onto Cs 34. This voltage sampled is the signal voltage (Vss). The amplifier 92 is reset during this phase.

The feedback capacitors Cf 68 and 72 are also reset by sampling Ramp_P 96 and Ramp_N 100 onto them during this phase through switches 94 and 98 controlled by the RampConn signal.

The voltage $V_{column}$ is sampled from the column 18 to the inverting input 32 of the operational amplifier 92 through sampling capacitor $C_s$ 34 during the sr phase when switch 36 is closed and to the non-inverting input 38 of the operational amplifier 92 through sampling capacitor $C_s$ 40 during the ss phase when switch 42 is closed. As will be disclosed herein, the operational amplifier 92 serves as both the PGA and the comparator of the circuit of FIG. 5.

Figure 10:
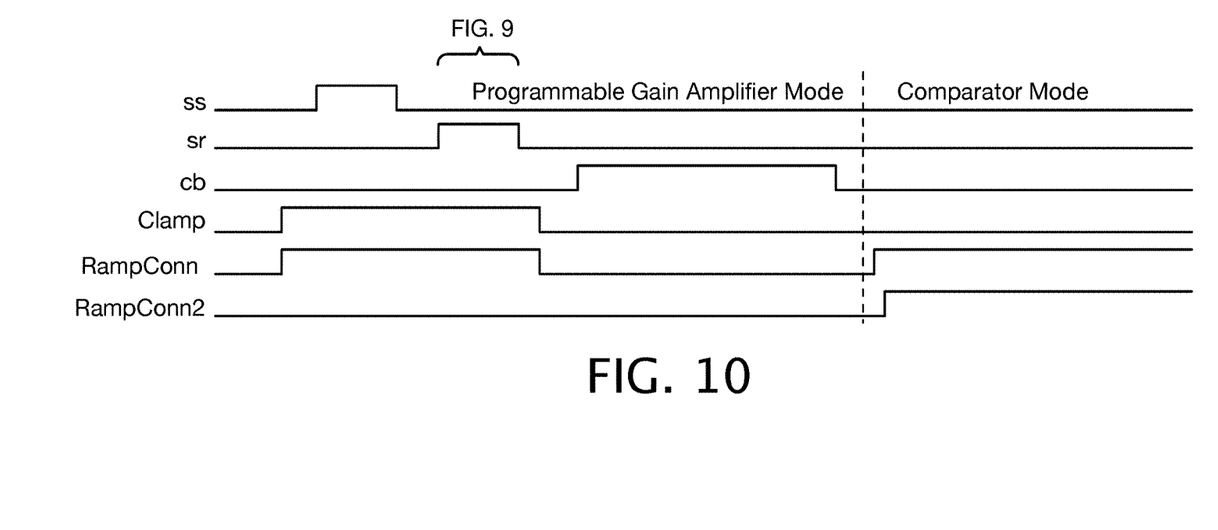
FIG. 10 is the timing diagram of FIG. 6 including brackets that indicate the control signals applied to the switches to configure the circuit during the sample "sr" phase of operation of the circuit.

FIG. 10 is a timing diagram showing the control signals applied to the switches during the sample sr phase of operation of the circuit depicted in FIG. 9.

During these two sampling phases sr and ss shown in FIGS. 7 and 9, switches 44 and 46, controlled by the Clamp signal are closed, shorting the output node 48 of the amplifier 92 to its inverting input 32 and shorting the output node 50 of the amplifier to its non-inverting input 38. The RampConn2 signal is de-asserted during these two sampling phases sr and ss. The normally-closed switches 104a and 104b connect the $C_{load}$ capacitors 102a and 102b to make the amplifier 92 more stable. This can change based on the amplifier architecture used. Switches 108a, 108b, 112a, and 112b are open, disconnecting the clamping diodes 106a and 106b and resistive load 110a and 110b from the circuit.

Figure 11:
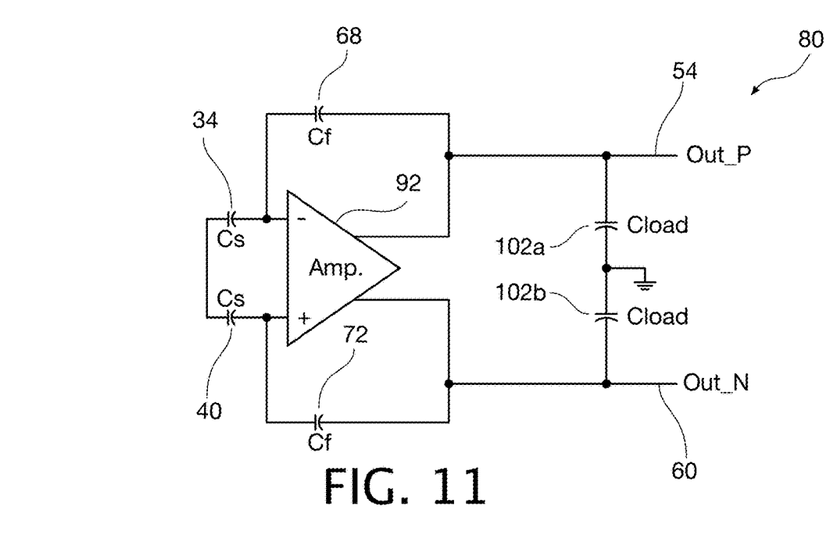
FIG. 11 is a schematic diagram of the circuit of FIG. 5 showing the equivalent circuit resulting from the states of the switches of the circuit of FIG. 5 diagram when the circuit is in programmable gain amplifier phase of operation.

Referring now to FIG. 11, a schematic diagram depicts the configuration of the circuit of FIG. 5 when the circuit is in programmable gain amplifier phase of operation. During this phase of operation, switches 64, 66, 70, 104a, and 104b are closed. Switches 36, 42, 44, 46, 94, 98, 108a, 108b, 112a, and 112b are open.

During this phase of circuit operation, which is the PGA mode of the operational amplifier 92, after the Clamp signal has been de-asserted, the cb signal is asserted. The crowbar signal cb closes switch 64, shorting together the input plates of Cs capacitors 34 and 40. The crowbar signal cb also closes switch 66, connecting feedback capacitor Cf 68 between the output node 48 of amplifier 92 and its inverting input 32, and closes switch 70, connecting feedback capacitor Cf 72 between the output node 50 of amplifier 30 and its non-inverting input 38.

The feedback capacitors Cf 68 and 72 and the sampling capacitors Cs 34 and 40 are connected so that, at the end of the crowbar cb phase of circuit operation, the output of the amplifier 92 (the difference of voltages at output nodes 54 and 60 is:

(Out_P)−(Out_N)=(Vsr−Vss)*Cs/Cf+(Ramp_P_i−Ramp_N_i), where Ramp_P_i and Ramp_N_i are the initial ramp voltages. This calculation takes the offset into account. Ignoring this offset (i.e, (Ramp_P_i−Ramp_N_i)=0) simplifies the equation to (Out_P)−(Out_N)=(Vsr−Vss)*Cs/Cf Vss is the $V_{column}$ during the ss phase of FIG. 7; and Vsr is the $V_{column}$ during the sr phase of FIG. 9.

Figure 12:
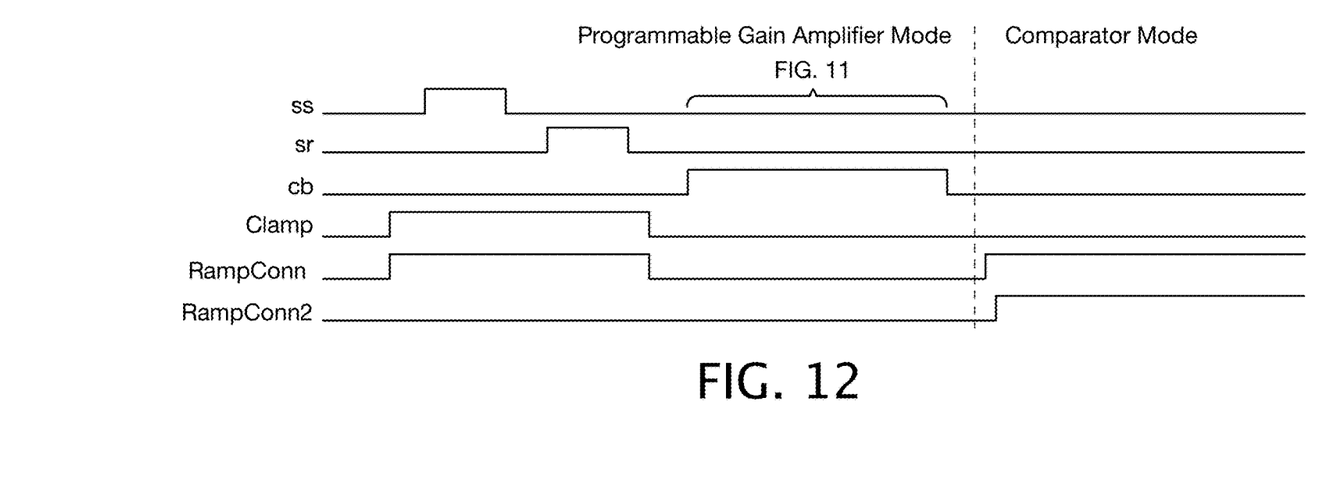
FIG. 12 is the timing diagram of FIG. 6 including brackets that indicate the control signals applied to the switches to configure the circuit during the programmable gain amplifier phase of operation of the circuit.

Referring now to FIG. 12, a timing diagram shows the control signals applied to the switches to configure the circuit during the programmable gain amplifier phase of operation of the circuit of FIG. 11.

Figures 13, 14, 15A, 15B:
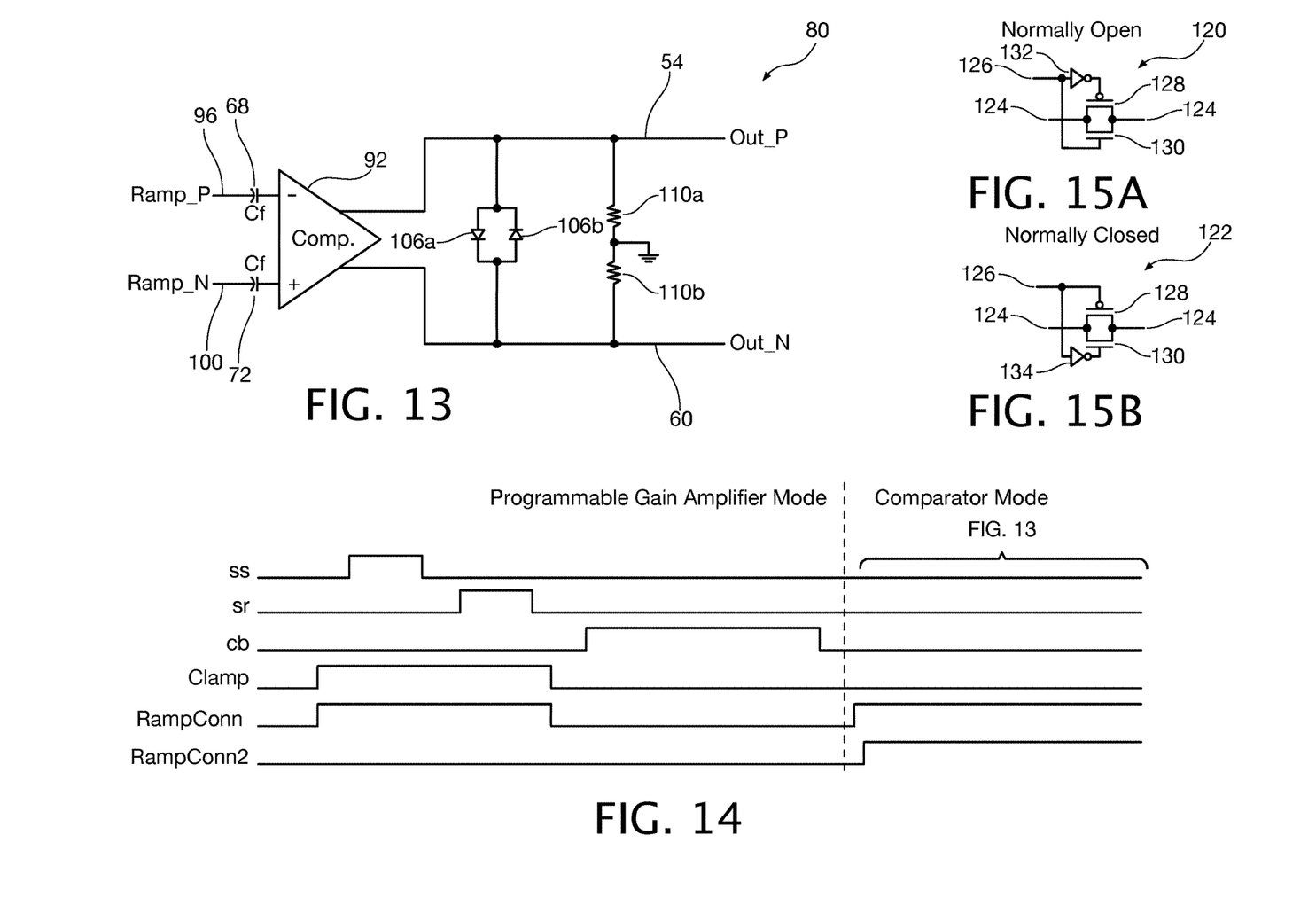
FIG. 13 is a schematic diagram of the circuit of FIG. 5 showing the equivalent circuit resulting from the states of the switches of the circuit of FIG. 5 diagram when the circuit is in comparator phase of operation.
FIG. 14 is the timing diagram of FIG. 6 including brackets that indicate the control signals applied during the comparator phase of operation of the circuit.
FIG. 15A is a schematic diagram of a passgate configured as a normally closed switch.
FIG. 15B is a schematic diagram of a passgate configured as a normally open switch.

FIG. 13 is a schematic diagram of the circuit of FIG. 5 and shows the equivalent circuit resulting from the states of the switches of the circuit of FIG. 5 diagram when the circuit is in comparator phase of operation. During this phase of operation, switches 94, 98, 108a, 108b, 112a, and 112b are closed. Switches 36, 42, 44, 46, 64, 66, 70, 104a, and 104b are open.

Switches 108a and 108b connect clamping diodes 108a and 108b across the output nodes 54 and 60 of the circuit to reduce the voltage swing in the comparator mode, to allow the comparator to switch faster. Switches 112a and 112b connect the load resistors 112a and 112b across the output nodes 54 and 60 of the circuit to increase the bandwidth of the comparator.

The difference between the voltage at the Out_P and Out_N nodes 54 and 60 is =Out_P−Out_N=(Vss−vsr)*Cs/Cf−(Ramp_P−Ramp_N). This voltage is converted to rail-to-rail by following latches.

FIG. 14 is a timing diagram showing the control signals applied during the comparator phase of operation of the circuit.

The differential voltage output at nodes 84 and 86 now is:

(Out_P)−(Out_N)=(Vsr−Vss)*Cs/Cf−(Ramp_P−Ramp_N)

This circuit operation described with reference to FIGS. 5 through 14 achieves the same operation as in the prior art, but by combining the amplifier and the comparator preamplifier.

In the combined amplifier and comparator 90 disclosed herein and depicted in FIG. 5, as well as in the prior-art amplifier and comparator depicted in FIG. 1, the various switches used in the circuitry may comprise CMOS passgates. Passgates that are configured as normally open switches are identified by reference numeral 120 are depicted in FIG. 15A. Passgates that are configured as normally closed switches are identified by reference numeral 122 are depicted in FIG. 15B. Both passgates 120 and 122 have main terminals 124, and a control terminal 126 and are formed from a p-channel transistor 128 connected in parallel with an n-channel transistor 130.

Passgate 120 has an inverter 132 connected between the control input 126 and the gate of the p-channel transistor 128. The gate of the n-channel transistor 130 is directly connected to the control input 126. A low level signal on the control terminal 126 turns off the passgate 120, isolating main terminals 124 from each other, and a high level signal on the control input 126 turns on the passgate 120, connecting together main terminals 124.

Passgate 122 has an inverter 134 connected between the control input 126 and the gate of the n-channel transistor 130. The gate of the p-channel transistor 128 is directly connected to the control input 126. A low level signal on the control terminal 126 turns on the passgate 122, connecting together main terminals 124, and a high level signal on the control input 126 turns off the passgate 122, isolating main terminals 124 from each other. Persons of ordinary skill in the art will appreciate that all of the switches may be configured as shown in FIG. 15A if an additional inverter is connected between the RampConn2 signal and the input 126 any of the switches shown in FIG. 15A that are configured as being normally closed.

Figure 16:
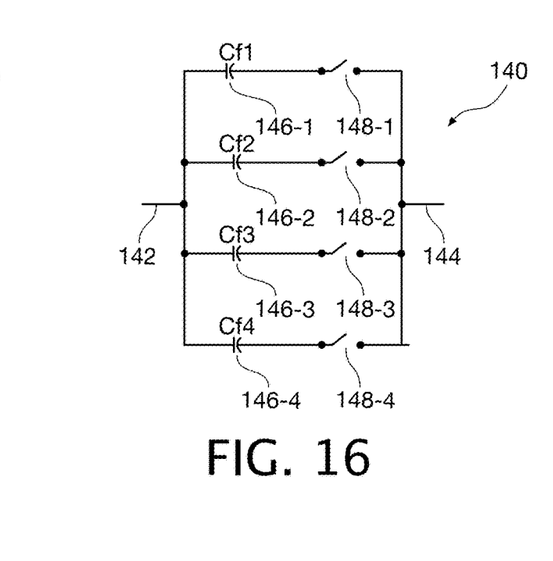
FIG. 16 is a schematic diagram that shows an illustrative circuit for implementing programmable gain in the amplifier circuit shown in FIG. 11.

Referring now to FIG. 16, a schematic diagram shows an illustrative circuit 140 for implementing programmable gain in the amplifier circuit shown in FIG. 11 by providing a programmable value for the capacitor Cf (reference numeral 68 and 72 in FIGS. 7, 9, and 11). The total capacitance of Cf between nodes 142 and 144 can be varied between the value of capacitor Cf1 (146-1), Cf1+Cf2 (146-1+146-2), Cf1+Cf2+Cf3 (146-1+146-2+146-3), and Cf1+Cf2+Cf3+Cf4 (146-1+146-2+146-3+146-4) by selectively closing one or more of switches 148-1, 148-2, 148-3, and 148-4. The switches 148-1, 148-2, 148-3, and 148-4 can be passgates as illustrated in FIGS. 15A and 15B.

If all of the capacitors have the same value (0.25 Cf), the gain can be selectable between 1, 1.33, 2, and 4 by closing one, two, three, or all four of switches 148-1, 148-2, 148-3, and 148-4. Persons of ordinary skill in the art will appreciate that the values of the capacitors 146-1, 146-2, 146-3, and 146-4 need not be equal and can be weighted (e.g., 1-2-4-8) to provide other selectable capacitance values.

Figure 17:
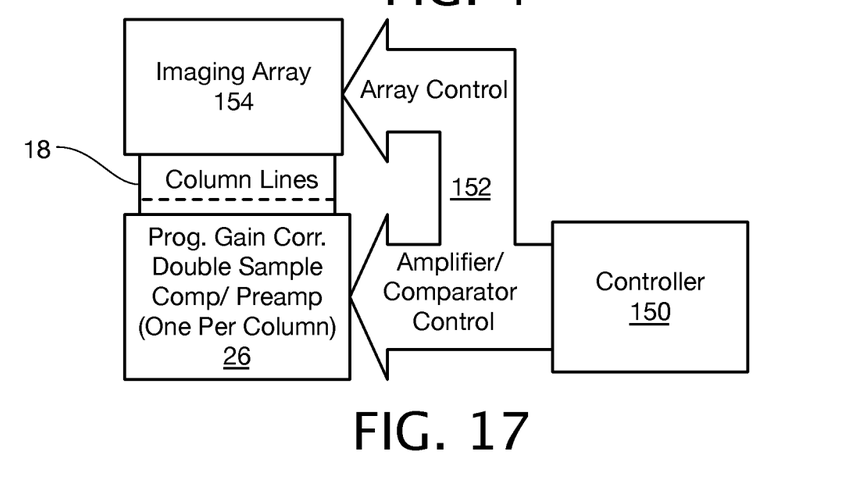
FIG. 17 is a block diagram showing controller coupled to an imaging array and to a combined amplifier and comparator including a programmable gain amplifier with correlated double sampling and comparator in accordance with an aspect of the invention.

Referring now to FIG. 17, a block diagram shows a controller 150 having control lines 152 coupled to an imaging array 154 and to programmable gain amplifier(s) 26 (one per column) with correlated double sampling and comparator in accordance with an aspect of the invention. The controller 150 is configured to control the operation of the imaging array 154 over the control lines 152 in a manner known in the art to capture images. The controller 150 is also configured to provide the control signals to control the switches that configure and the programmable gain amplifier(s) with correlated double sampling and comparators 26 and provide the other control signals to direct its operation in the various modes as discussed herein.

Combining the programmable gain amplifier and comparator provides a low-power and low-area readout circuit design in an image sensor. The present invention provides a one-stage implementation of correlated double sampling, offset creation, and comparison with the ramp voltage. The amplifier is reconfigured as a comparator preamplifier during the ramping phase. Compared to separate programmable gain amplifier and comparator stages, this architecture provides low noise because the programmable gain amplifier is not operational during the comparator mode, resulting in noise from only one amplifier during both phases. This architecture also meets same noise specification as the prior-art amplifier using lower power. This architecture also consumes a smaller area on the integrated circuit die.

The prior-art architecture requires two extra sampling capacitors 78 and 80 for sampling to the comparator inputs. Considering just the sampling noise; in order to have the same sampling noise performance as the present invention, the prior-art architecture requires sampling capacitors having twice the capacitance of those required by the present invention. This requires a sampling capacitor area for the prior-art architecture that is six times the area of the sampling capacitor area required by the present invention. In addition, since the sampling capacitance is doubled, Cf also has to be doubled for unity gain. Hence this architecture achieves a lower noise performance in a smaller area.

With twice the number of sampling capacitors at the comparator input for the conventional architecture, the load increase seen by the programmable gain amplifier compared to the architecture of the present invention is a factor of 4 for small signal settling. For the same settling performance; and assuming a single stage amplifier, the current in the amplifier has to increase $4x$ for the same unity gain frequency. This results in further increase in amplifier area and second order effects due to parasitic poles. Hence this architecture achieves a lower power and lower noise performance in a smaller area.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A switchable amplifier and comparator circuit comprising:
   an operational amplifier having an inverting input, a non-inverting input, a first differential output and a second differential output, the first differential output switchably coupled to the inverting input and the second differential output switchably coupled to the non-inverting input;
   a first feedback capacitor having a first plate coupled to the inverting input and a second plate switchably coupled to the first differential output;
   a second feedback capacitor having a first plate coupled to the non-inverting input and a second plate switchably coupled to the second differential output;
   a capacitive load switchably coupled between the first differential output and the second differential output;
   a diode clamp circuit switchably coupled between the first differential output and the second differential output; and
   a resistive load switchably coupled between the first differential output and the second differential output.

2. The switchable amplifier and comparator circuit of claim 1 further comprising:
   a first sampling capacitor coupled between the inverting input and a first switched input node, the first switched input node switchably coupled to a signal input node; and
   a second sampling capacitor coupled between the non-inverting input and a second switched input node, the second switched input node switchably coupled to the signal input node and switchably coupled to the first switched input node.

3. The switchable amplifier and comparator circuit of claim 2 wherein:
   the second plate of the first feedback capacitor is switchably coupled to a positive ramp signal; and
   the second plate of the second feedback capacitor is switchably coupled to a negative ramp signal.

4. The switchable amplifier and comparator circuit of claim 3 wherein:
   the first feedback capacitor includes a plurality of individual first feedback capacitors that are programmably connected in parallel with one another; and
   the second feedback capacitor includes a plurality of individual second feedback capacitors that are programmably connected in parallel with one another.

5. The switchable amplifier and comparator circuit of claim 4 wherein:
   the plurality of individual first feedback capacitors that are programmably connected in parallel with one another have equal capacitance; and
   the plurality of individual second feedback capacitors that are programmably connected in parallel with one another have capacitance values that are weighted with respect to one another.

6. The switchable amplifier and comparator circuit of claim 4 wherein the plurality of individual first feedback capacitors are programmably connected in parallel with one another through passgates and the plurality of individual second feedback capacitors are programmably connected in parallel with one another through passgates.

7. A method for downloading data from an imaging array into a single output circuit comprising a differential amplifier switchably configurable to be one of a correlated double sampling programmable gain amplifier and a comparator, the method comprising:
   switchably configuring a capacitive load, a diode clamp, and a resistive load coupled between first and second outputs of the differential amplifier to be a correlated double sampling programmable gain amplifier and a comparator;
   sampling a pixel sensor output from a column of the array;
   sampling a reset state output from the column of the array;
   generating a programmable gain correlated double signal sampled signal from the sampled pixel sensor output and the sampled reset state output; and
   switchably configuring the capacitive load, the diode clamp, and the resistive load coupled between the first and second outputs of the differential amplifier as a comparator and comparing the programmable gain correlated double signal sampled signal with a ramp signal.

* * * * *